(12) United States Patent
Inuiya

(10) Patent No.: US 7,663,685 B2
(45) Date of Patent: Feb. 16, 2010

(54) HYBRID SOLID-STATE IMAGE PICKUP ELEMENT AND IMAGE PICKUP APPARATUS USING THE SAME

(75) Inventor: Masafumi Inuiya, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 544 days.

(21) Appl. No.: 11/282,692

(22) Filed: Nov. 21, 2005

(65) Prior Publication Data
US 2006/0125944 A1    Jun. 15, 2006

(30) Foreign Application Priority Data
Nov. 19, 2004  (JP)  .......................... P2004-335570

(51) Int. Cl.
*H04N 3/14* (2006.01)
(52) U.S. Cl. ...................... 348/315; 348/280
(58) Field of Classification Search ................ 348/266, 348/267, 272, 273, 280, 294, 315, 340
See application file for complete search history.

(56) References Cited

U.S. PATENT DOCUMENTS

| 4,602,289 | A  | * | 7/1986  | Sekine  | .................. | 348/315 |
| 7,129,466 | B2 | * | 10/2006 | Iwasaki | .................. | 250/214.1 |
| 7,400,023 | B2 | * | 7/2008  | Watanabe et al. | ........... | 257/448 |

| 2002/0075391 | A1 | * | 6/2002  | Shizukuishi | ................ | 348/319 |
| 2005/0224694 | A1 | * | 10/2005 | Yaung | ..................... | 250/208.1 |

FOREIGN PATENT DOCUMENTS

JP    2002-83946 A    3/2002
JP    2003-332551 A    11/2003

* cited by examiner

*Primary Examiner*—Timothy J Henn
(74) *Attorney, Agent, or Firm*—Sughrue Mion, PLLC

(57) ABSTRACT

A solid-state image pickup element has: a photoelectric converting film which is stacked above a semiconductor substrate; plural photoelectric converting elements which are arranged in the row direction and the column direction on the semiconductor substrate, and signal charge accumulating portions in which signal charges generated in the photoelectric converting film are accumulated; vertical transfer paths which are formed in the semiconductor substrate, and which transfer signal charges accumulated in the photoelectric converting elements and the signal charge accumulating portions, in the column direction; a horizontal transfer path which transfers the signal charges transferred from the vertical transfer paths, in the row direction; and an output section which outputs color signals corresponding to the signal charges transferred from the horizontal transfer path. The vertical transfer paths are formed so that two of them are disposed between the photoelectric converting elements adjacent to each other in the row direction, and between the signal charge accumulating portions, and they are formed so as to meander in the column direction between the columns.

13 Claims, 11 Drawing Sheets

FIG. 7A

| G_f | G_c | G_g |
|---|---|---|
| G_b | G_a | G_d |
| G_h | G_e | G_i |

FIG. 7B

| R_f | B_c | R_g |
|---|---|---|
| B_b | R_a | B_d |
| R_h | B_e | R_i |

FIG. 8A

| G_f | G_c | G_g |
|---|---|---|
| G_b | G_a | G_d |
| G_h | G_e | G_i |

FIG. 8B

| R_f | B_c | R_g |
|---|---|---|
| B_b | R_a | B_d |
| R_h | B_e | R_i |

FIG. 8C

| R_f | B_c | R_g |
|---|---|---|
| B_b | R_a | B_d |
| R_h | B_e | R_i |

FIG. 9A

| 1/5 f | c | 1/5 g |
|---|---|---|
| b | 1/5 a | d |
| 1/5 h | e | 1/5 i |

FIG. 9B

| f | 1/4 c | g |
|---|---|---|
| 1/4 b | a | 1/4 d |
| h | 1/4 e | i |

FIG. 10A

| G f | G c | G g |
|---|---|---|
| G b | G a | G d |
| G h | G e | G i |

FIG. 10B

| B f | R c | B g |
|---|---|---|
| R b | B a | R d |
| B h | R e | B i |

*FIG. 14A*

| x f | x ↓c | x g |
|---|---|---|
| x →b | X ←a | x ←d |
| x h | x e | x i |

*FIG. 14B*

| y f | y ↓c | y g |
|---|---|---|
| y →b | Y ←a | y ←d |
| y h | y e | y i |

*FIG. 14C*

| G f | G ↓c | G g |
|---|---|---|
| G →b | G' ←a | G ←d |
| G h | G e | G i |

*FIG. 15A*

| 1/12 f | 1/12 c | 1/12 g |
|---|---|---|
| 1/12 b | 1/3 a | 1/12 d |
| 1/12 h | 1/12 e | 1/12 i |

*FIG. 15B*

| 1/9 f | 1/9 c | 1/9 g |
|---|---|---|
| 1/9 b | 1/9 a | 1/9 d |
| 1/9 h | 1/9 e | 1/9 i |

HYBRID SOLID-STATE IMAGE PICKUP ELEMENT AND IMAGE PICKUP APPARATUS USING THE SAME

BACKGROUND OF THE INVENTION

1. Field of the Invention

The present invention relates to a solid-state image pickup element in which signal charges are transferred by CCDs and an image pickup apparatus using the same.

2. Description of the Related Art

In the related art, as a solid-state image pickup element in which a color filter is not used, a stack-type solid-state image pickup element disclosed in, for example, JP-A-2002-83946 has been proposed. The stack-type solid-state image pickup element has a configuration where photoelectric converting films made of three organic materials which respectively detect red (R) light, green (G) light, and blue (B) light are stacked above a semiconductor substrate, signal charges generated in the films are accumulated in accumulation diodes formed on the semiconductor substrate, and the signal charges accumulated in the accumulation diodes are read out by a signal read circuit such as vertical CCDs and a horizontal CCD, and then transferred. In such a stack-type solid-state image pickup element, the utilization efficiency of light can be improved, and a false color can be suppressed, so that a color image of high quality can be produced.

The stack-type solid-state image pickup element requires a contact conductor through which one of two electrodes sandwiching each of the photoelectric converting films stacked above the semiconductor substrate is connected to each of the accumulation diodes formed on the semiconductor substrate. The material of the contact conductor is a metal such as tungsten, copper, or molybdenum, and a high temperature of 300 degrees or higher is necessary in formation of the conductor structure. On the other hand, the photoelectric converting films stacked above the semiconductor substrate are made of organic materials, and hence their performance is obviously impaired when exposed to a high temperature of 200 degrees or higher. In the stack-type solid-state image pickup element, for example, a production step of forming a contact conductor and then forming one of the photoelectric converting elements is repeated three times. Consequently, there is a problem that the performance of the photoelectric converting element which has been previously formed is impaired by the temperature of the formation of the contact conductor.

As a solid-state image pickup element which can solve the problem, a hybrid element has been proposed in which photoelectric converting elements detecting R and B and made of silicon are integrated on a semiconductor substrate, and one photoelectric converting film detecting G and made of an organic material is stacked above the semiconductor substrate (for example, see JP-A-2003-332551 (Paragraph 0035)). In the hybrid solid-state image pickup element, since the performance of silicon is not impaired even at a high temperature of 300 degrees or higher, the lower portion (the photoelectric converting elements and contact conductors) can be previously formed by a high-temperature process, and then the photoelectric converting film can be formed by a low-temperature process. Therefore, the performance of the photoelectric converting film can be prevented from being impaired.

In the hybrid solid-state image pickup element, the light-receiving area of the photoelectric converting film in the upper portion can be increased, and the aperture ratio of the photoelectric converting film in the upper portion can be set to approximately 100%. Therefore, the amount of signal charges generated in the photoelectric converting film can be increased. Furthermore, the area of the accumulation diode disposed in the lower portion can be made smaller, and hence the sizes of the photoelectric converting elements can be increased. Therefore, the amount of signal charges accumulated in the photoelectric converting elements can be increased.

Since the amount of signal charges is increased, color image data of high quality can be produced. When a CCD is used as a signal read circuit, however, a signal charge transfer capacity sufficient for the increased amount of signal charges is required.

SUMMARY OF THE INVENTION

The invention has been conducted in view of the circumstances. It is an object of the invention to provide a solid-state image pickup element that is a hybrid solid-state image pickup element which has a photoelectric converting film in an upper portion, and photoelectric converting elements comprising silicon in a lower portion, and which can cope with increases in amount of signal charges generated in the photoelectric converting film, and in that of signal charges accumulated in the photoelectric converting elements. It is also an object of the invention to provide an image pickup apparatus using the solid-state image pickup element.

According to the invention, there is provided a solid-state image pickup element comprising: a semiconductor substrate; a photoelectric converting film stacked above the semiconductor substrate; a plurality of photoelectric converting elements arranged in a row direction and a column direction perpendicular to the row direction on the semiconductor substrate; a plurality of signal charge accumulating portions in which signal charges generated in the photoelectric converting film are accumulated, the signal charge accumulating portions being arranged in the row direction and the column direction on the semiconductor substrate; and a signal read circuit which reads out to outside signals corresponding to signal charges accumulated in the photoelectric converting elements and the signal charge accumulating portions, the signal read circuit being formed in the semiconductor substrate, wherein the signal read circuit comprises: vertical transfer paths which read signal charges accumulated in the plural photoelectric converting elements and the signal charge accumulating portions, and which transfer the signal charges in the column direction; a horizontal transfer path which transfers signal charges transferred from the vertical transfer paths, in the row direction; and an output section which outputs color signals corresponding to the signal charges transferred from the horizontal transfer path, and wherein the vertical transfer paths are formed in such a manner that: two of the vertical transfer paths are present between first ones of said plurality of photoelectric converting elements, the first ones being adjacent to each other in the row direction; and two of the vertical transfer paths are present between second ones of said plurality of signal charge accumulating portions, the second ones being adjacent to each other in the row direction, and the vertical transfer paths elongate in the column direction.

According to the configuration, the signal charge transfer capacity of the vertical transfer paths can be increased, and hence it is possible to cope with an increase in amount of signal charges accumulated in the photoelectric converting film and the photoelectric converting elements.

In the solid-state image pickup element of the invention, said plurality of photoelectric converting elements comprise include at least two kinds of photoelectric converting elements, each kind of which detect a color different from a color detected by the photoelectric converting film, there are formed first rows in which said at least two kinds of photoelectric converting elements are alternately arranged and second rows in which the signal charge accumulating portions are arranged, the first rows and the second rows alternately being arranged in such a manner that, in adjacent ones of the first rows and the second rows, those of the photoelectric converting elements and those of the signal charge accumulating portions are shifted from each other in the row direction by about ½ of arrangement pitches in the row direction of the photoelectric converting elements and the signal charge accumulating portions, and the vertical transfer paths are formed with meandering in the column direction.

In the solid-state image pickup element of the invention, the vertical transfer paths comprises: first vertical transfer paths which transfer only signal charges from the signal charge accumulating portions; and second vertical transfer paths which transfer only signal charges from the photoelectric converting elements.

In the solid-state image pickup element of the invention, a signal charge transfer capacity of the first vertical transfer paths is larger than a signal charge transfer capacity of the second vertical transfer paths.

In the solid-state image pickup element of the invention, the photoelectric converting film is sandwiched by pixel electrode films for respectively defining photoelectric converting regions of the photoelectric converting film, and an opposing electrode which is opposed to the pixel electrode films, and the pixel electrode films and the photoelectric converting elements are placed so as not to overlap with each other when viewed from a vertical direction to a plane of the semiconductor substrate.

In the solid-state image pickup element of the invention, the pixel electrode films comprises a metal.

In the solid-state image pickup element of the invention, the solid-state image pickup element further comprises a plurality of microlenses which converge light respectively on said plurality of photoelectric converting elements, said plurality of microlenses being disposed above the photoelectric converting film.

In the solid-state image pickup element of the invention, the solid-state image pickup element further comprises a plurality of microlenses which converge light respectively on said plurality of photoelectric converting elements, said plurality of microlenses being disposed between the photoelectric converting film and said plurality of photoelectric converting elements.

In the solid-state image pickup element of the invention, the photoelectric converting film detects green light, and said plurality of photoelectric converting elements comprise photoelectric converting elements which detect red light, and photoelectric converting elements which detect blue light.

In the solid-state image pickup element of the invention, the photoelectric converting film comprises an organic material.

According to the invention, there is provided an image pickup apparatus comprising an imaging section which includes the above-mentioned solid-state image pickup element.

BRIEF DESCRIPTION OF THE DRAWINGS

FIGS. 7A-7B are views showing a state where color signals obtained from a solid-state image pickup element illustrating the second embodiment of the invention are mapped in a memory;

FIGS. 8A-8C are views illustrating a process of producing color image data;

FIGS. 9A-9B are views showing coefficients used in the process of producing color image data;

FIGS. 10A-10B are view showing a state where color signals obtained from a solid-state image pickup element illustrating a third embodiment of the invention are mapped in a memory;

FIGS. 14A-14C are views illustrating the signal processing method in the third embodiment of the invention; and FIGS. 15A-15B are views showing an example of coefficients used in the signal processing method in the third embodiment of the invention.

DETAILED DESCRIPTION OF THE INVENTION

Hereinafter, embodiments of the invention will be described with reference to the accompanying drawings.

First Embodiment

Figure 1:
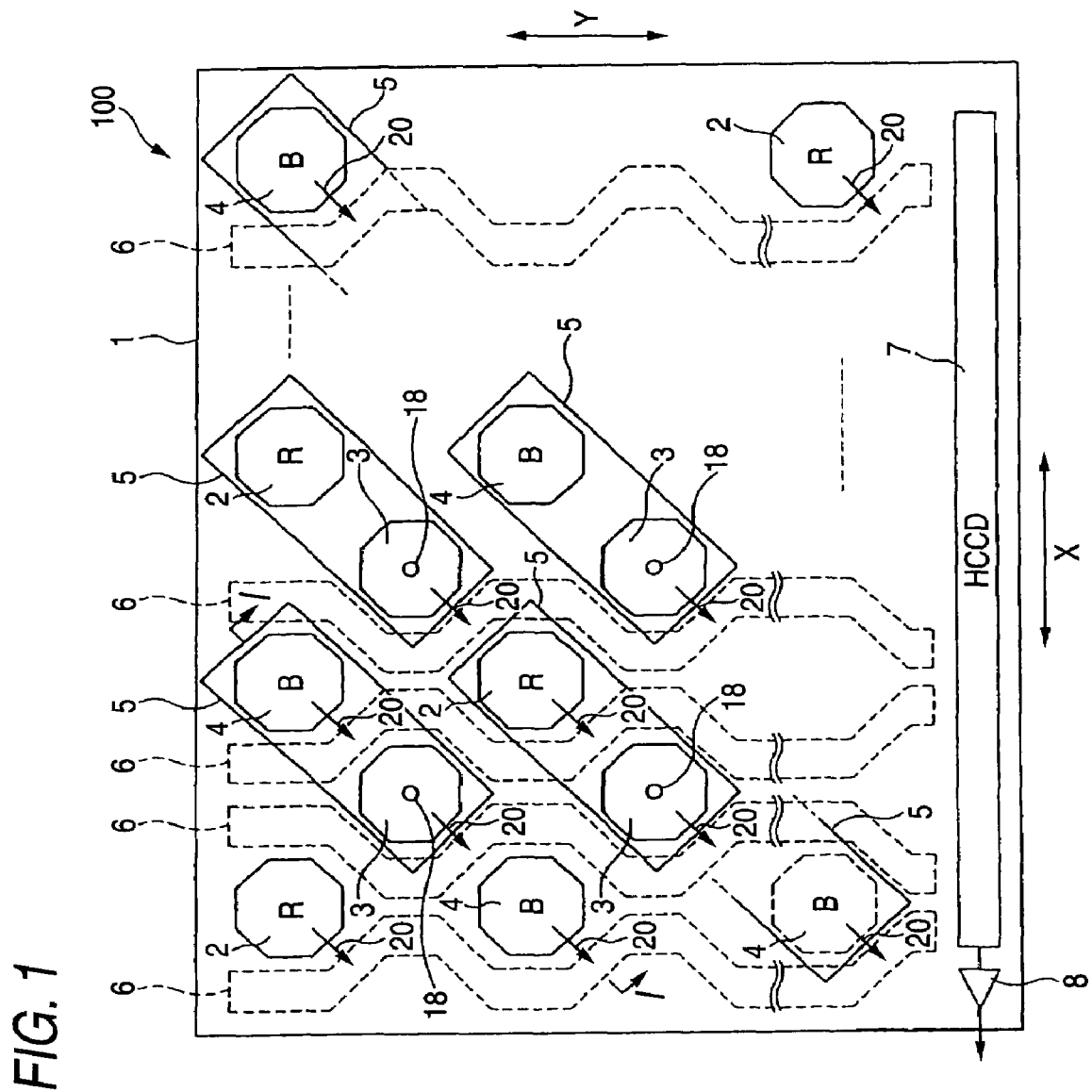
FIG. 1 is a surface diagram of a solid-state image pickup element illustrating a first embodiment of the invention.
Figure 2:
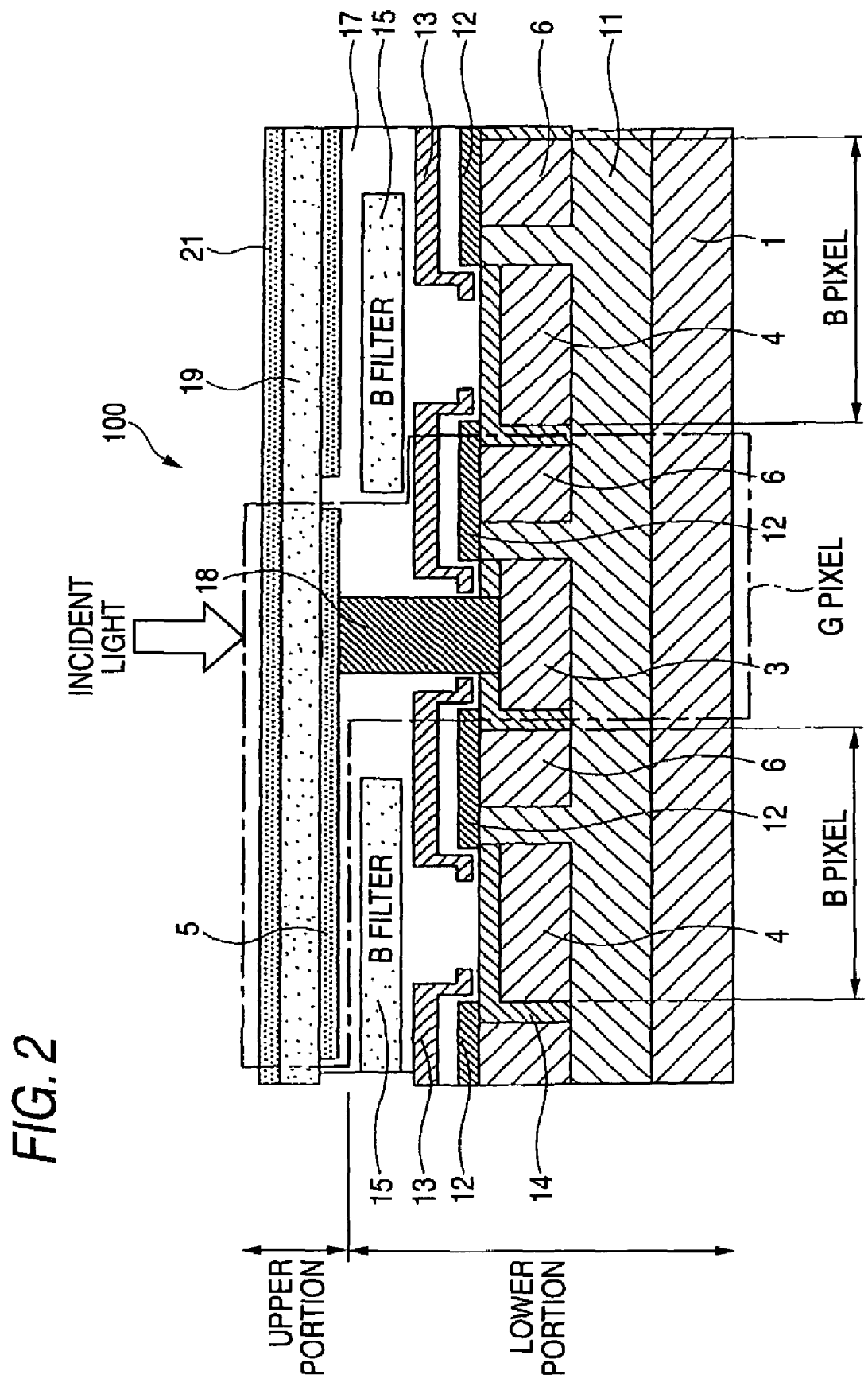
FIG. 2 is a cross-sectional diagram taken along the line I-I of FIG. 1.

FIG. 1 is a surface diagram of a solid-state image pickup element 100 illustrating a first embodiment of the invention, and FIG. 2 is a cross-sectional diagram taken along the line I-I of FIG. 1.

On a surface portion of a semiconductor substrate 1, plural photoelectric converting elements 2, 4 made of silicon, and plural signal charge accumulating portions 3 are arranged in the row direction (the X direction in FIG. 1) and the column direction (the Y direction in FIG. 1). In the embodiment, it is assumed that the total number of the photoelectric converting elements 2 and the photoelectric converting elements 4 is equal to the number of the signal charge accumulating portions 3. The number of the signal charge accumulating portions 3 is equal to the maximum pixel data number of color image data which can be produced on the basis of color signals obtained from the solid-state image pickup element 100.

As shown in FIG. 1, in the odd rows, the photoelectric converting elements (photodiodes, hereinafter referred to as R photoelectric converting elements) 2 which detect red (R) and generate signal charges of red corresponding to the detection, and in which the signal charges are accumulated, and the photoelectric converting elements (photodiodes, hereinafter referred to as B photoelectric converting elements) 4 which detect blue (B) and generate signal charges of blue corresponding to the detection, and in which the signal charges are accumulated are alternately arranged. In the even rows, the signal charge accumulating portions 3 (accumulation diodes) in which signal charges of green are accumulated are arranged. In the odd rows, rows in which the arrangement begins with the R photoelectric converting element 2, and those in which the arrangement begins with the B photoelectric converting elements 4 are arranged alternately in the column direction. The odd rows and the even rows are arranged with being shifted from each other in the row direction by about ½ of their arrangement pitches in the row direction.

A photoelectric converting film 19 (see FIG. 2) which detects green light and generate signal charges corresponding to the detection is stacked above the surface of the semiconductor substrate 1. Each pixel electrode film 5 disposed on the photoelectric converting film 19 is disposed so as to cover the signal charge accumulating portion 3 and R or B photoelectric converting element 2 or 4 which is adjacent to the portion. The photoelectric converting film 19 contains an organic material.

In the surface portion of the semiconductor substrate 1, vertical transfer paths 6 (vertical CCD) which transfer signal charges accumulated in the photoelectric converting elements 2, 4 and the signal charge accumulating portions 3, in the Y direction are disposed. A horizontal transfer path 7 (horizontal CCD) which transfers the signal charges transferred from the vertical transfer paths 6, in the X direction, and an output section 8 which outputs color signals corresponding to the signal charges transferred from the horizontal transfer path 7 are disposed in a lower edge portion of the semiconductor substrate 1.

The vertical transfer paths 6 are formed so that two of them are disposed in each of gaps between the photoelectric converting elements 2, 4 arranged in the X direction, and between the signal charge accumulating portions 3 arranged in the X direction, and they are formed so as to meander in the Y direction between the photoelectric converting element columns and the signal charge accumulating portion columns.

According to the configuration, the vertical transfer paths 6 which are adjacent to each other in the X direction can be adjacent to each other between the photoelectric converting elements or between the signal charge accumulating portions, and hence conductors through which the vertical transfer paths are connected to each other can be disposed in this adjacent portion. Therefore, the signal charge transfer capacity of the vertical transfer paths 6 can be made larger as compared with a configuration such as an interline CCD, and it is possible to sufficiently cope with an increase in amount of signal charges accumulated in the photoelectric converting elements 2, 4 and the signal charge accumulating portions 3.

The configuration of the vertical transfer paths 6 shown in FIG. 1 is described in detail in JP-A-10-136391. Please refer to this publication.

Signal charges accumulated in the R photoelectric converting elements 2, the signal charge accumulating portions 3, and the B photoelectric converting elements 4 are read out to the vertical transfer paths 6 through read gates 20 (in FIG. 1, schematically indicated by arrows), and then transferred to the horizontal transfer path 7. Thereafter, the signal charges are transferred to the output section 8 by the horizontal transfer path 7, and then color signals (a red signal, a green signal, and a blue signal) corresponding respectively to the signal charges are output from the output section 8. In this way, the red signal, the green signal, and the blue signal are read out from the solid-state image pickup element 100.

The read gates 20 for the R photoelectric converting elements 2, the B photoelectric converting elements 4, and the signal charge accumulating portions 3 are disposed on the side of the vertical transfer paths 6 which are placed respectively on the left sides of the R photoelectric converting elements 2, the B photoelectric converting elements 4, and the signal charge accumulating portions 3. Specifically, the vertical transfer paths 6 placed on the left sides of the signal charge accumulating portions 3 are dedicated transfer paths for transferring only green signal charges (corresponding to the first vertical transfer paths), and the vertical transfer paths 6 placed on the left sides of the photoelectric converting elements 2, 4 are dedicated transfer paths for transferring only red and blue signal charges (corresponding to the second vertical transfer paths).

In the solid-state image pickup element 100, since the amount of signal charges accumulated in the signal charge accumulating portions 3 can be made larger than that of signal charges accumulated in the R photoelectric converting elements 2 and the B photoelectric converting elements 4, the signal charge transfer capacity of the vertical transfer paths 6 placed on the left sides of the signal charge accumulating portions 3 is preferably larger than that of the vertical transfer paths 6 placed on the left sides of the photoelectric converting elements 2, 4. In order to increase the signal charge transfer capacity of the vertical transfer paths 6 placed on the left sides of the signal charge accumulating portions 3, for example, the areas of the signal charge accumulating portions 3 can be reduced, and the widths of the vertical transfer paths 6 can be correspondingly widened.

As shown in FIG. 2, p-well layers 11 are formed in the surface portion of the n-type semiconductor substrate 1, n-regions 4 are formed in blue (B) pixel regions in surface portions of the p-well layers 11, and photodiodes serving as the B photoelectric converting elements 4 are formed between the p-well layers 11 and the n-regions 4. Generated signal charges are accumulated in the n-regions 4.

In the illustrated example, an n-region 3 is formed in a surface portion of the p-well layer 11 between each two of the n-regions 4, and the n-region 3 functions as the green signal charge accumulating portion 3. On the right sides of the n-regions 3, 4, n-regions 6 are formed so as to be slightly separated from the n-regions 3, 4, respectively. The n-regions 6 constitute the vertical transfer paths 6 shown in FIG. 1.

Transfer electrodes which function also as the read electrodes 12, and which reach the n-regions 3, 4 are formed on surface portions of the n-regions 6. A light shielding film 13 is disposed above the transfer electrodes. Portions of the p-well layer 11 which overlap with the read electrodes 12 constitute the read gate 20 shown in FIG. 1.

P$^+$-regions 14 are disposed in left-side face and surface portions of the n-regions 3, 4 so that the n-regions are separated from adjacent vertical transfer paths 6 and the defect level of the surface portion is reduced. A silicon oxide film which is not shown is formed in the uppermost surface portion of the semiconductor substrate 1, and the transfer electrodes 12 are formed on the film.

A color filter 15 through which blue is transmitted is disposed on the positions of openings of the light shielding film 13 above the n-regions 4. The color filter 15, the light shielding film 13, and the transfer electrodes 12 are buried in a transparent insulating layer 17.

The transparent pixel electrode films 5 which have been described with reference to FIG. 1 are separately formed on the surface of the insulating layer 17, and the pixel electrode films 5 and the n-regions 3 are connected respectively to each other by vertical conductors 18. Each of the vertical conductors 18 is electrically insulated from portions other than the pixel electrode film 5 and the n-region 3 which are connected to each other. The photoelectric converting film 19 extending over the whole face of the semiconductor substrate 1 is stacked on the pixel electrode films 5, and a common transparent opposing electrode film 21 is formed on the photoelectric converting film. The pixel electrode films 5 can be formed by, for example, ITO. The pixel electrode films 5 define photoelectric converting regions of the photoelectric converting film 19, and the regions of the photoelectric converting film 19 sandwiched by the opposing electrode film 21 and the pixel electrode films 5 are the photoelectric converting regions. Signal charges generated in the photoelectric converting regions are accumulated in the signal charge accumulating portions 3.

FIG. 2 shows a section of a portion including the B photoelectric converting elements 4 and the signal charge accumulating portion 3. A section of a portion including the R photoelectric converting elements 2 and the signal charge accumulating portion 3 has the same configuration of FIG. 2 except that the n-regions 4 are replaced with the n-regions 2 and the color filter 15 is a red filter through which red is transmitted. Therefore, its description is omitted.

When light is incident on the thus configured solid-state image pickup element 100, green-wavelength light of the incident light is absorbed into the photoelectric converting film 19, and green signal charges are generated in the photoelectric converting film 19. The signal charges are caused by applying a bias potential to the pixel electrode films 5 to flow into the n-regions 3 through the vertical conductors 18, and accumulated therein.

Red (R)- and blue (B)-wavelength light of the incident light is transmitted through the photoelectric converting film 19, and red light is further transmitted through the red color filter to be incident on the n-regions 2. As a result, signal charges corresponding to the amount of the red light are generated and accumulated in the n-regions 2. Similarly, blue light is further transmitted through the color filter 15 to be incident on the n-regions 4, and signal charges corresponding to the amount of the blue light are generated and accumulated in the n-regions 4.

The red, green, and blue signal charges accumulated in the n-regions 2, 3, 4 are read out to the vertical transfer paths 6 by applying a high potential to the read electrodes 12, transferred from the read electrodes to the horizontal transfer path 7, and further transferred in the horizontal transfer path 7 to the output section 8. Thereafter, the output section 8 outputs color signals corresponding to the signal charges.

As described above, according to the solid-state image pickup element 100 of the invention, the signal charge transfer capacity of the vertical transfer paths 6 can be made larger than that in an interline CCD. In the solid-state image pickup element 100 having the configuration shown in FIG. 2, the employment of vertical transfer paths of a large signal charge transfer capacity as the signal read circuit leads to an increased area of the pixel electrode films 5 and an expanded size of the photoelectric converting elements. Therefore, color image data of higher quality can be produced.

In the solid-state image pickup element 100 of the embodiment, the signal reading method of a conventional CCD image sensor can be applied as is, and hence the production cost can be reduced.

The solid-state image pickup element 100 of the embodiment can be produced simply by: producing the semiconductor substrate 1 by using directly the design of a conventional single-type CCD color image sensor or CMOS image sensor; forming the vertical conductors 18 in place of a green filter which must be disposed in a conventional sensor; and forming the pixel electrode films 5, the photoelectric converting film 19, and the opposing electrode film 21 in the upper portion. Therefore, the production cost can be reduced.

Figure 3:
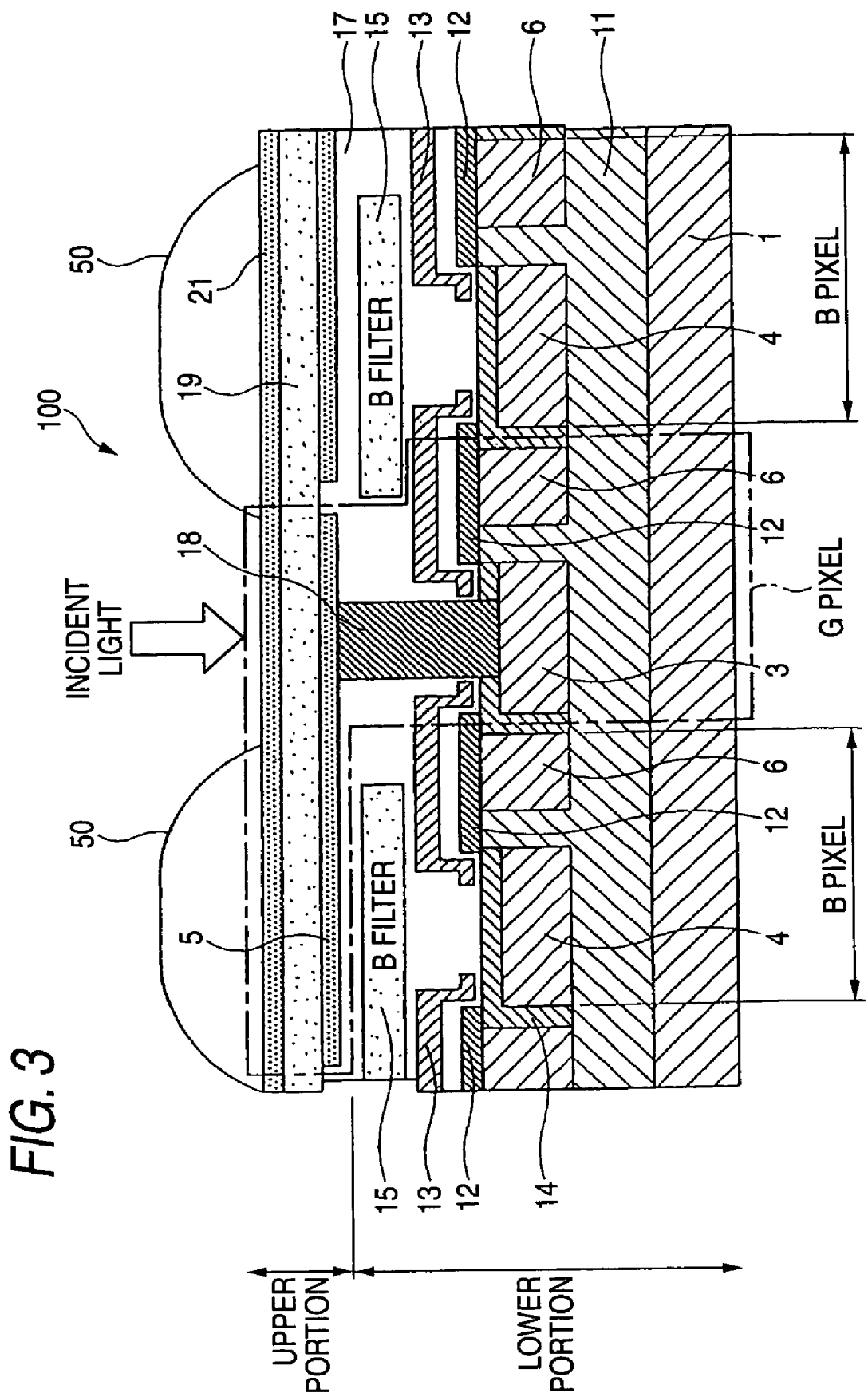
FIG. 3 is a cross-sectional diagram of a state where microlenses are mounted on the solid-state image pickup element illustrating the first embodiment of the invention.
Figure 4:
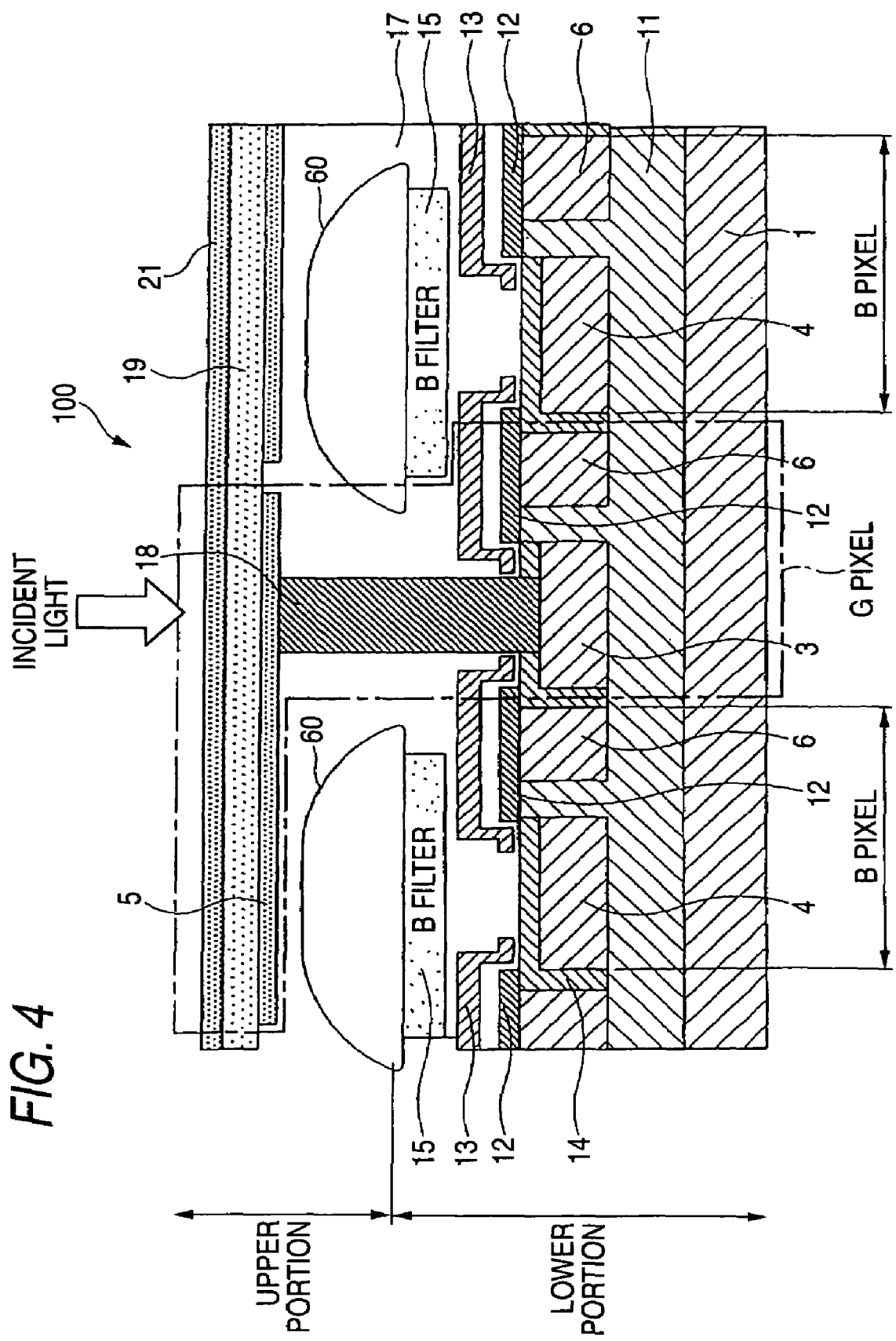
FIG. 4 is a cross-sectional diagram of a state where microlenses are mounted on the solid-state image pickup element illustrating the first embodiment of the invention.

In the solid-state image pickup element 100 of the embodiment, as shown in FIG. 3, microlenses 50 are preferably mounted on the opposing electrode film 20 to converge red and blue incident light on inner sides of the openings of the light shielding film 13 in the n-regions 2, 4. Alternatively, as shown in FIG. 4, microlenses 60 are preferably mounted between the color filters 15 and the red filters, and the pixel electrode films 5 to converge red and blue incident light on inner sides of the openings of the light shielding film 13 in the n-regions 2, 4.

Figure 5:
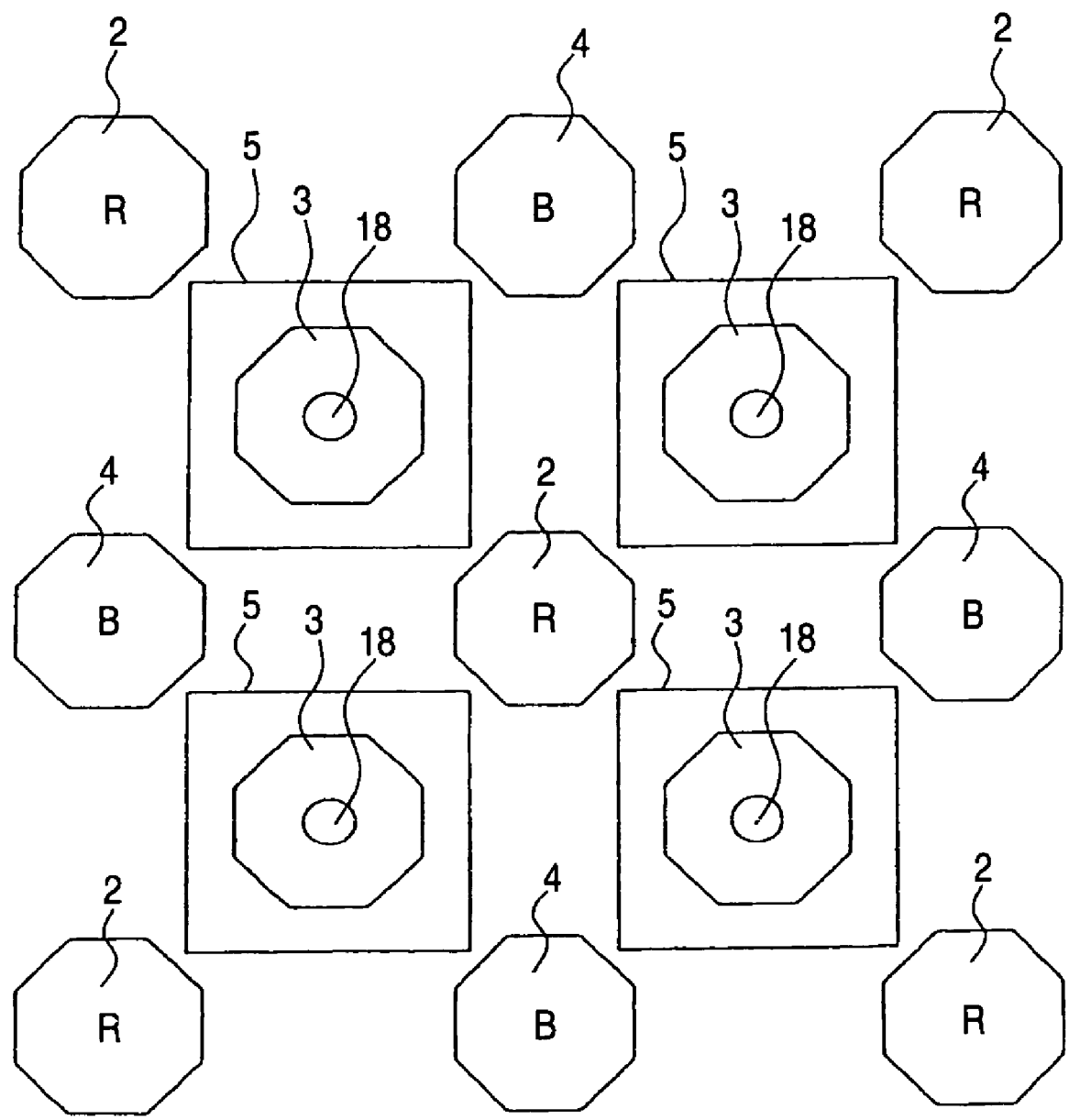
FIG. 5 is a diagram showing another example of arrangement of photoelectric converting elements and signal charge accumulating portions of the solid-state image pickup element illustrating the first embodiment of the invention.

The arrangements of the R photoelectric converting elements 2, the B photoelectric converting elements 4, and the signal charge accumulating portions 3, the sizes and shapes of the R photoelectric converting elements 2, the B photoelectric converting elements 4, and the pixel electrode films 5, and the like are not restricted to those shown in FIG. 1, and may have another configuration such as shown in FIG. 5. In FIG. 5, the components identical with those of FIG. 1 are denoted by the same reference numerals.

In the configuration shown in FIG. 5, the R photoelectric converting elements 2 and the B photoelectric converting elements 4 are prevented from overlapping with the pixel electrode films 5. According to the configuration, since the pixel electrode films 5 and the photoelectric converting elements 2, 4 do not overlap with each other, the pixel electrode films 5 can be formed by a metal which is not transparent, such as aluminum or tungsten, and hence there is an advantage that the pixel electrode films can be easily produced. When the configuration of FIG. 5 is employed, the center of gravity of the green signal exactly coincides with the position of the signal charge accumulating portion 3, and hence there is another advantage that the signal can be easily processed.

The embodiment has the configuration in which the two kinds of photoelectric converting elements, or the photoelectric converting elements which detect red, and those which detect blue are disposed in the semiconductor substrate of the solid-state image pickup element 100. However, the configuration is not restricted to this. A configuration in which two or more kinds of photoelectric converting elements are disposed may be used.

Second Embodiment

In the solid-state image pickup element 100, as shown in FIG. 2, the aperture ratio of the R photoelectric converting elements 2 and the B photoelectric converting elements 4 which are disposed in the lower portion is very smaller than that of the photoelectric converting film 19 which is disposed in the upper portion. When a fixed amount of light is incident on the solid-state image pickup element 100, the amount of light incident on the R photoelectric converting elements 2 and the B photoelectric converting elements 4 which are disposed in the lower portion is smaller than that of light incident on the photoelectric converting film 19 because of influences due to the color filters, the light shielding film 13, the vertical conductors 18, the aperture ratio, etc. Therefore, the sensitivities of color signals obtained from the upper portion and the lower portion may be dispersed, or the S/N (Signal to Noise ratio) of a color signal obtained from the lower portion may be impaired. When color image data are produced by using color signals obtained from the solid-state image pickup element 100, therefore, the quality of the data is degraded. In the embodiment, an image pickup apparatus which can prevent the dispersion in sensitivity and degradation of the S/N from occurring will be described.

An image pickup apparatus illustrating the second embodiment of the invention is an apparatus which can take an image of an object and produce color image data, such as a digital camera.

Figure 6:
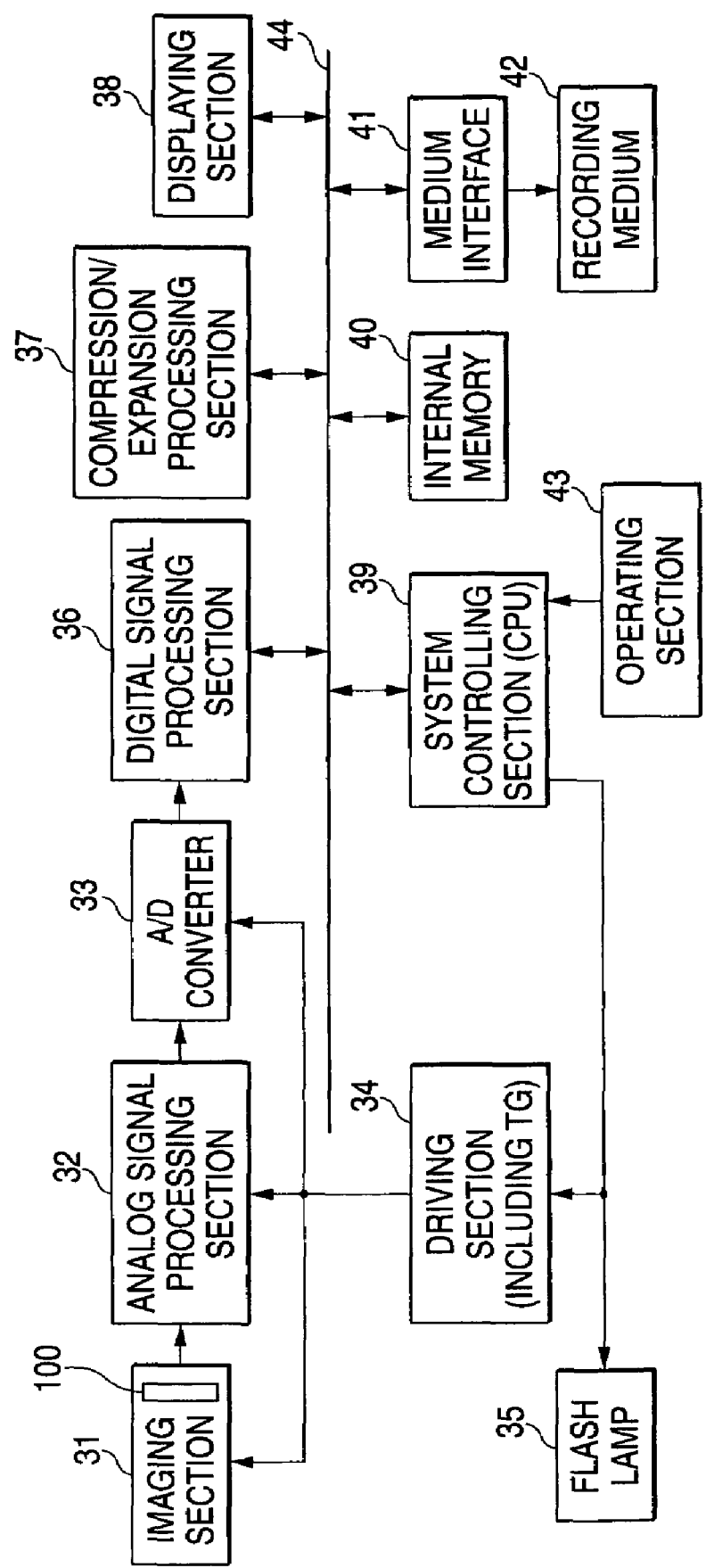
FIG. 6 is a diagram schematically showing the configuration of a digital camera illustrating a second embodiment of the invention.

FIG. 6 is a diagram schematically showing the configuration of a digital camera illustrating the second embodiment of the invention.

The digital camera of FIG. 6 comprises an imaging section 31, an analog signal processing section 32, an A/D converter 33, a driving section 34, a flash lamp 35, a digital signal processing section 36, a compression/expansion processing section 37, a displaying section 38, a system controlling section 39, an internal memory 40, a medium interface 41, a recording medium 42, and an operating section 43. The digital signal processing section 36, the compression/expansion processing section 37, the displaying section 38, the system controlling section 39, the internal memory 40, and the medium interface 41 are connected to a system bus 44.

The imaging section 31 takes an image of an object by an optical system such as an imaging lens, and the solid-state image pickup element 100 shown in FIG. 1, and outputs analog color signals (the red signal, the blue signal, and the green signal). The analog signal processing section 32 applies a predetermined analog signal process on the color signals obtained in the imaging section 31. The A/D converter 33 converts the analog color signals processed by the analog signal processing section 32, to digital signals.

In an imaging process, the optical system and the solid-state image pickup element 100 are controlled via the driving section 34. In response to turning-on of a release switch (not shown) operated by a release button (not shown) which is a part of the operating section 43, the solid-state image pickup device 100 is driven at a predetermined timing by a driving signal supplied from a timing generator (in FIG. 6, abbreviated to TG) which is included in the driving section 34. Analog color signals corresponding to signal charges accumulated in the R photoelectric converting elements 2, the B photoelectric converting elements 4, and the signal charge accumulating portions 3 are output to the analog signal processing section 32. In the embodiment, the color signals from the solid-state image pickup element 100 are read by interlace reading in which reading is performed in two processes or odd rows and even rows of the solid-state image pickup element 100 are separately read. The driving section 34 is controlled so as to output a predetermined driving signal by the system controlling section 39.

The digital signal processing section 36 applies a digital signal process corresponding to an operation mode which is set by the operating section 43, on the digital color signals supplied from the A/D converter 33. Processes to be conducted by the digital signal processing section 36 include a black level correcting process (OB process), a linear matrix correcting process, a white balance adjusting process, a gamma correcting process, a color image producing process, and a Y/C converting process. The digital signal processing section 36 is configured by, for example, a DSP.

The compression/expansion processing section 37 applies a compressing process on a Y/C data obtained in the digital signal processing section 36, and an expanding process on compressed image data obtained from the recording medium 42.

The displaying section 38 includes, for example, an LCD display device, and displays a color image based on color image data which have undergone the digital signal process after an imaging process, and also an image based on image data which have been obtained by expanding compressed image data recorded on the recording medium 42. The displaying section can display also a through image obtained in an imaging process, various status of the digital camera, information related to the operation, and other data.

The internal memory 40 is, for example, a DRAM, and used as a work memory for the digital signal processing section 36 and the system controlling section 39. The internal memory is used also as a buffer memory which temporarily stores picked-up image data to be recorded onto the recording medium 42, and that for image data to be displayed on the displaying section 38. The medium interface 41 is used for inputting and outputting data into and from the recording medium 42 such as a memory card.

The system control section 39 is configured mainly by a processor which operates in accordance with predetermined programs, and controls the operations of the whole digital camera including an imaging operation.

The operating section 43 is used for conducting various operations during the use of the digital camera.

In the digital camera shown in FIG. 6, with respect to a green signal constituting one pixel data of color image data, the green signal obtained from the upper portion of the solid-state image pickup element 100 is used as it is, and, with respect to read and blue signals constituting one pixel data of color image data, the red and blue signals the numbers of which are equal to the number of pixels of color image data are produced by using the red and blue signals obtained from the lower portion, thereby producing color image data. Namely, the digital camera of the embodiment performs the same process as a digital camera that produces color image data by using two solid-state image pickup elements, i.e., a solid-state image pickup element outputting only green signals the number of which is equal to the number of pixels of color image data, and that outputting red and blue signals the numbers of which are equal to the number of pixels of color image data. The digital camera of the embodiment produces color image data by a process similar to that in a digital camera comprising a known dual- or triple-type CCD image sensor.

Hereinafter, the operation of the digital camera shown in FIG. 6 will be described.

When the release switch is turned on, the solid-state image pickup element 100 is driven by the driving section 34, and performs a process of imaging an object. First, red and blue signals corresponding to signal charges accumulated in the R photoelectric converting elements 2 and the B photoelectric converting elements 4 are output from the solid-state image pickup element 100 to the analog signal processing section 32. Next, green signals corresponding to signal charges accumulated in the signal charge accumulating portions 3 are output from the solid-state image pickup element 100 to the analog signal processing section 32. The red, blue, and green signals are supplied to the digital signal processing section 36 via the analog signal processing section 32 and the A/D converter 33.

The digital signal processing section 36 performs mapping of the input red, blue, and green signals in the internal memory 40 while corresponding the color signals to the arrangement of the n-regions 2, 3, 4 from which the color signals are obtained.

Hereinafter, a color image data producing process by the digital signal processing section 36 will be described with using: color signals obtained from nine or 3-row by 3-column photoelectric converting elements centered at the photoelectric converting element 2 or 4 corresponding to one pixel data of color image data; and color signals obtained from nine or 3-row by 3-column signal charge accumulating portions 3 centered at the signal charge accumulating portion 3 corresponding to one pixel data of color image data.

FIG. 7 is a view showing color signals mapped in the internal memory 40. FIG. 7A is a view showing a state where color signals (in the figures, indicated by "G") obtained from nine signal charge accumulating portions 3 centered at the signal charge accumulating portion 3 corresponding to one pixel data of color image data are mapped, and FIG. 7B is a view showing a state where color signals (in the figures, a red signal is indicated by "R", and a blue signal is indicated by "B") obtained from nine photoelectric converting elements centered at the R photoelectric converting element 2 corresponding to one pixel data of color image data are mapped. In the configuration shown in FIG. 1, the center of gravity of each green signal is actually positioned at the center of the corresponding pixel electrode film 5, but it is assumed in the embodiment that the position of the center of gravity of each green signal is that of the signal charge accumulating portion 3.

In FIG. 7, a point corresponding to one pixel data of color image data is defined as a sample point, and sample points are indicated by characters a to i, respectively.

The digital signal processing section 36 performs a process of producing one pixel data while providing the sample points shown in FIG. 7 with three color signals or red, blue, and green signals.

Hereinafter, a signal process which is performed when color image data are produced in each sample point will be described.

A green signal exists in each sample point. As descried above, a sufficient signal amount is obtained with respect to the green signal, and the S/N is satisfactory. Therefore, the digital signal processing section 36 sets the green signal in each sample point, as it is, as a green signal constituting one pixel data (see FIG. 8A).

A red signal and a blue signal are color signals corresponding to signal charges accumulated in the R photoelectric converting elements 2 and the B photoelectric converting elements 4. As described above, therefore, the signal amount is small, and the S/N is not satisfactory.

With respect to a sample point where a red signal exists, the digital signal processing section 36 produces a red signal constituting one pixel data, in the sample point where the red signal exists, with using the red signal existing in the sample point and red signals existing in sample points adjacent to the sample point (see FIG. 8B).

For example, a signal which is obtained by: multiplying red signals in a sample point a, and sample points f to i adjacent to sample point a by a predetermined coefficient; and cumulating the red signals multiplied by the coefficient is set as a red signal constituting one pixel data in sample point a. The coefficient may be any numeric value such as ⅕ (see FIG. 9A) or 1.

In the case where the coefficient is ⅕, the newly produced amount of the red signal in sample point a is approximately equal to the signal amount of a red signal obtained from one R photoelectric converting element 2. Therefore, the sensitivity of the red signal cannot be raised, but the S/N can be correspondingly improved. By contrast, in the case where the coefficient is 1, the newly produced amount of the red signal in sample point a can be set to be five times the signal amount of a red signal obtained from one R photoelectric converting element 2. Therefore, the sensitivity of the red signal can be raised, but the S/N is correspondingly impaired.

With respect to a sample point where a blue signal exists, similarly, the digital signal processing section 36 produces a blue signal constituting one pixel data, in the sample point where the blue signal exists, with using the blue signal existing in the sample point and blue signals existing in sample points adjacent to the sample point.

Next, the digital signal processing section 36 performs a process of interpolating a red or blue signal constituting one pixel data, on a sample point where a red or blue signal constituting one pixel data does not exist. In the interpolation, various known techniques can be employed. When a blue signal is to be interpolated to sample point a, for example, a signal which is obtained by: multiplying blue signals in sample points b to e in the periphery of sample point a by a predetermined coefficient; and cumulating the blue signals multiplied by the coefficient is set as a blue signal constituting one pixel data in sample point a (see FIG. 8(c)). The coefficient may be any numeric value such as ¼ (see FIG. 9B) or 1.

In this way, the digital signal processing section 36 performs a process of providing the sample points with red, blue, and green signals constituting one pixel data.

In accordance with the operation mode of the digital camera, it is possible to determine whether the priority is given to the sensitivity or to the S/N in production of red and blue signals constituting color image data. When the photographing ISO sensitivity is set higher, or when a scene of an insufficient light amount is to be imaged, for example, the coefficient may be set to 1 so that color image data in which the sensitivity is enhanced is produced. When the photographing ISO sensitivity is set lower, or when a scene of an excessive light amount is to be imaged, the coefficient may be set to ¼ or ⅕ so that color image data in which the S/N is improved is produced.

When the coordinate of a sample point on the map is indicated by (m, n) with the origin in sample point a, the process of producing a red signal, a blue signal, and a green signal constituting one pixel data in a sample point where a red signal exists is indicated by mathematical expressions in the following manner.

In the following expressions, k(m, n) is a coefficient set in a sample point at coordinate (m, n), g(m, n) is a green signal before a process of producing one pixel data in the sample point at coordinate (m, n) (a green signal obtained from the signal charge accumulating portion 3 corresponding to one pixel data), b(m, n) is a blue signal before a process of producing one pixel data in the sample point at coordinate (m, n) (a blue signal obtained from the B photoelectric converting element 4 corresponding to one pixel data), r(m, n) is a red signal before a process of producing one pixel data in the sample point at coordinate (m, n) (a red signal obtained from the R photoelectric converting element 2 corresponding to one pixel data), G(m, n) is a green signal after the process of producing one pixel data in the sample point at coordinate (m, n), B(m, n) is a blue signal after the process of producing one pixel data in the sample point at coordinate (m, n), and R(m, n) is a red signal after the process of producing one pixel data in the sample point at coordinate (m, n).

$$G(m,n)=g(m,n),$$

$$B(m,n)=k(m,n+1)*b(m,n+1)+k(m-1,n)*b(m-1,n)+k(m+1,n)*b(m+1,n)+k(m,n-1)*b(m,n-1),$$

$$R(m,n)=k(m-1,n+1)*r(m-1,n+1)+k(m+1,n+1)*r(m+1,n+1)+k(m,n)*r(m,n)+k(m-1,n-1)*r(m-1,n-1)+k(m+1,n-1)*r(m+1,n-1)$$

where b(m, n) is a newly produced blue signal after the adding process.

By contrast, the process of producing a red signal, a blue signal, and a green signal constituting one pixel data in a sample point where a blue signal exists is indicated by mathematical expressions in the following manner.

$$G(m,n)=g(m,n),$$

$$B(m,n)=k(m-1,n+1)*b(m-1,n+1)+k(m+1,n+1)*b(m+1,n+1)+k(m,n)*b(m,n)+k(m-1,n-1)*b(m-1,n-1)+k(m+1,n-1)*b(m+1,n-1),$$

$$R(m,n)=k(m,n+1)*r(m,n+1)+k(m-1,n)*r(m-1,n)+k(m+1,n)*r(m+1,n)+k(m,n-1)*r(m,n-1)$$

where r(m, n) is a newly produced red signal after the adding process.

As described above, according to the digital camera of the embodiment, when an object is imaged and color image data are produced, the sensitivities of red and blue signals constituting pixel data of the color image data can be enhanced, or the S/N can be improved. Therefore, color image data of high quality can be produced.

In the above description, the digital signal processing section 36 produces color image data. Alternatively, the process which is performed by the digital signal processing section 36 may be performed by the analog signal processing section 32. In the alternative, the analog signal processing section 32 may use the analog red, blue, and green signals supplied from the imaging section 31, and perform the same process as that performed by the digital signal processing section 36 to produce analog color image data. In the analog signal processing section 32, the adding process of red signals, and that of blue signals can be conducted by using a low-pass filter.

In the above description, the production of color image data of high quality is enabled by applying the signal process on the color signals output from the imaging section 31. In place of performing the signal process, the method of reading the color signals may be controlled to attain the same effects.

In this case, when the driving control of reading color signals from the solid-state image pickup element 100 is to be performed, the driving section 34 drives the solid-state image pickup element 100 so that a signal charge accumulated in a photoelectric converting element corresponding to one pixel data, and signal charges accumulated in photoelectric converting elements of the same kind which are adjacent to the photoelectric converting element are mixed with each other in the vertical transfer path 6 and the horizontal transfer path 7.

For example, it is assumed that the photoelectric converting element corresponding to one pixel data is the second R photoelectric converting element 2 from the left in the third row of the solid-state image pickup element 100 shown in FIG. 1. The driving section 34 controls the timing of a driving pulse so that a signal charge accumulated in the R photoelectric converting element 2, and four signal charges accumulated in the four R photoelectric converting elements 2 of the same kind which are adjacent to the R photoelectric converting element 2 are mixed with each other in the vertical transfer path 6 and the horizontal transfer path 7.

Similarly, the driving section 34 controls the timing of the driving pulse so that that a signal charge accumulated in the B photoelectric converting element 4, and four signal charges accumulated in the four B photoelectric converting elements 4 of the same kind which are adjacent to the B photoelectric converting element 4 are mixed with each other in the vertical transfer path 6 and the horizontal transfer path 7.

The digital signal processing section 36 performs a signal interpolating process by using the red and blue signals obtained from the solid-state image pickup element 100, and produces color image data with using also the green signal obtained from the solid-state image pickup element 100.

In this case, the numbers of the red and blue signals obtained from the solid-state image pickup element 100 are reduced to ⅕, and hence the resolution is lowered. However, it is possible to attain the same effects as those in the case where the coefficient used in the process performed in the digital signal processing section 36 is 1. Therefore, red, blue, and blue signals of high sensitivity can be fetched from the solid-state image pickup element 100, and color image data of high quality can be produced.

In the embodiment, the photoelectric converting film disposed in the upper portion of the solid-state image pickup element is that for detecting green, and the photoelectric converting elements disposed in the lower portion are those for detecting red and blue. The invention is not restricted to this configuration. In order to realize the signal process which has been described above, it is requested that the color detected by the photoelectric converting film disposed in the upper portion is different from the colors detected by the photoelectric converting elements disposed in the lower portion. For example, a configuration in which a photoelectric converting film for detecting red is disposed in the upper portion, and photoelectric converting elements for detecting blue and green are disposed in the lower portion, or that in which a photoelectric converting film for detecting blue is disposed in the upper portion, and photoelectric converting elements for detecting red and green are disposed in the lower portion may be employed. Green is higher in human visual sensitivity than other colors. When the photoelectric converting film of the upper portion in which the largest light-receiving area can be obtained detects green, therefore, color image data which are similar to the human sense can be produced.

Third Embodiment

In a solid-state image pickup element in which, as shown in FIG. 1, green signals the number of which is equal to that of all pixel data of color image data are output, and red and blue signals the numbers of which are smaller than the number of all pixel data of color image data are output, a process of interpolating the red and blue signals is performed, and hence there is the possibility that a false color is generated. In the embodiment, a signal process in which generation of such a false color can be suppressed will be described. The signal process is implemented in the digital signal processing section 36 or the analog signal processing section 32 shown in FIG. 6.

Hereinafter, a signal processing method will be described with using: color signals obtained from nine or 3-row by 3-column photoelectric converting elements centered at the photoelectric converting element 2 or 4 corresponding to one pixel data of color image data; and color signals obtained from nine or 3-row by 3-column signal charge accumulating portions 3 centered at the signal charge accumulating portion 3 corresponding to one pixel data of color image data.

FIG. 10 is a view showing color signals mapped in the internal memory 40. FIG. 10A is a view showing a state where color signals (in the figures, indicated by "G") obtained from nine signal charge accumulating portions 3 centered at the signal charge accumulating portion 3 corresponding to one pixel data of color image data are mapped, and FIG. 10B is a view showing a state where color signals (in the figures, a red signal is indicated by "R", and a blue signal is indicated by "B") obtained from nine photoelectric converting elements centered at the photoelectric converting element 4 corresponding to one pixel data of color image data are mapped.

In FIG. 10, sample points of color signals are indicated by characters a to i, respectively. In FIG. 10, the coordinate of sample point a is set to origin (m, n), and a coefficient set to coordinate (m, n) is indicated by k(m, n). Furthermore, a green signal at coordinate (m, n) is indicated by g(m, n), a red signal at coordinate (m, n) is indicated by r(m, n), and a blue signal at coordinate (m, n) is indicated by b(m, n).

Hereinafter, a signal process of producing color image data in sample points will be described.

Figure 11:
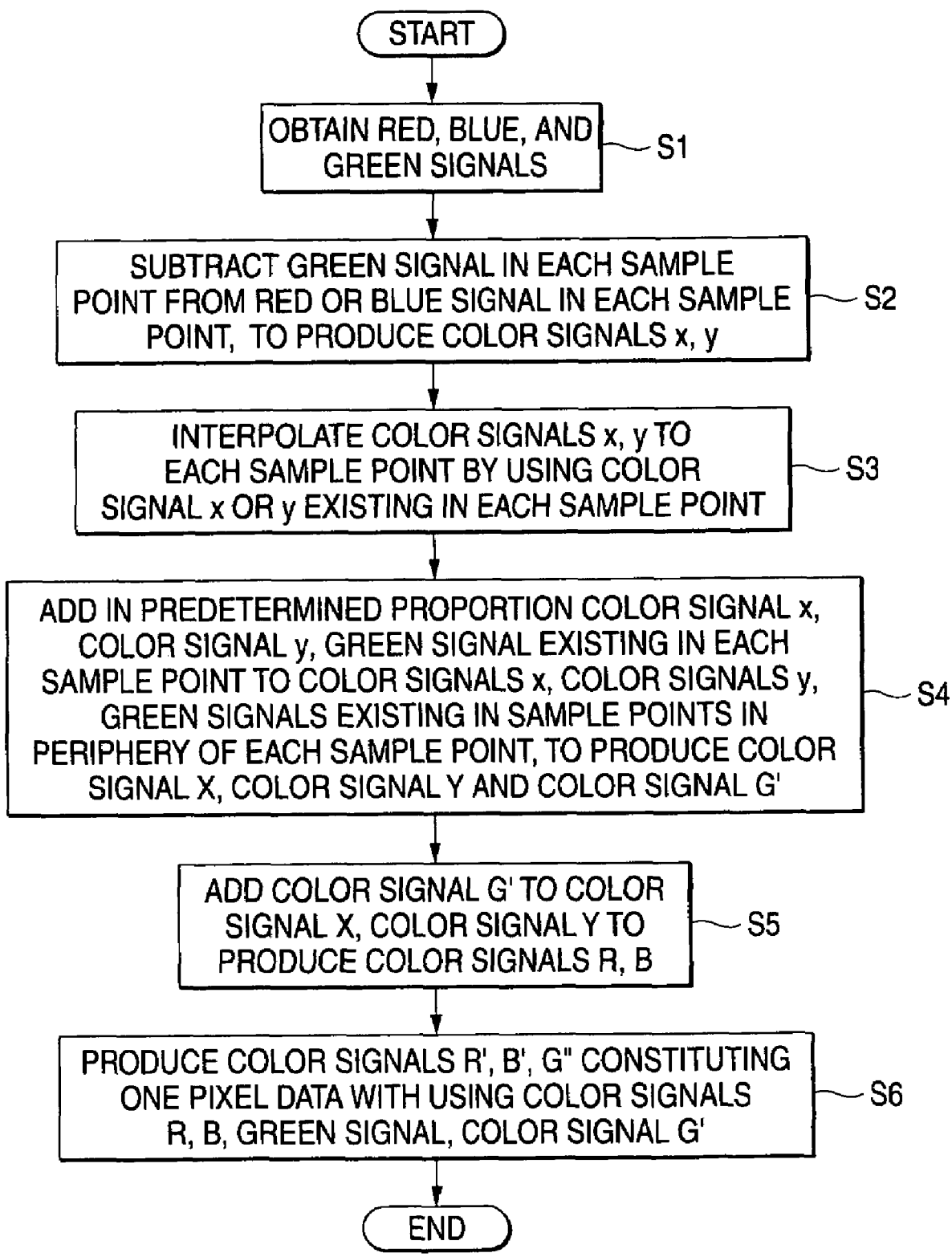
FIG. 11 is a flowchart illustrating a signal process in the third embodiment of the invention.

FIG. 11 is a flowchart illustrating the signal process performed by the digital signal processing section of the digital camera of the embodiment.

Figure 12:
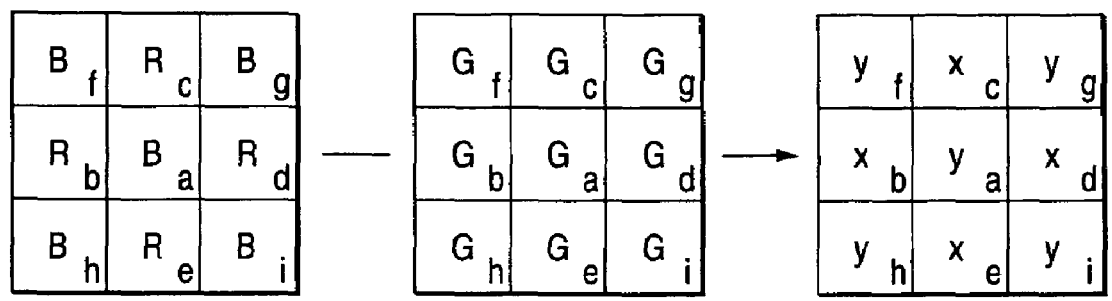
FIG. 12 is view illustrating a signal processing method in the third embodiment of the invention.

The digital signal processing section 36 obtains green, red, and blue signals from the solid-state image pickup element 100 (S1), and subtracts from a red or blue signal in each of sample points a to i, a green signal in the same sample point as the each sample point to, for the each sample point, produce a color signal x which is the difference between the red signal and the green signal, and a color signal y which is the difference between the blue signal and the green signal (S2, see FIG. 12). When the color signal x at coordinate (m, n) is indicated by x(m, n), and the color signal y at coordinate (m, n) is indicated by y(m, n), x(m, n) and y(m, n) are obtained from following expressions (1) and (2):

$$x(m,n)=r(m,n)-g(m,n) \quad (1)$$

$$y(m,n)=b(m,n)-g(m,n) \quad (2)$$

Figure 13:
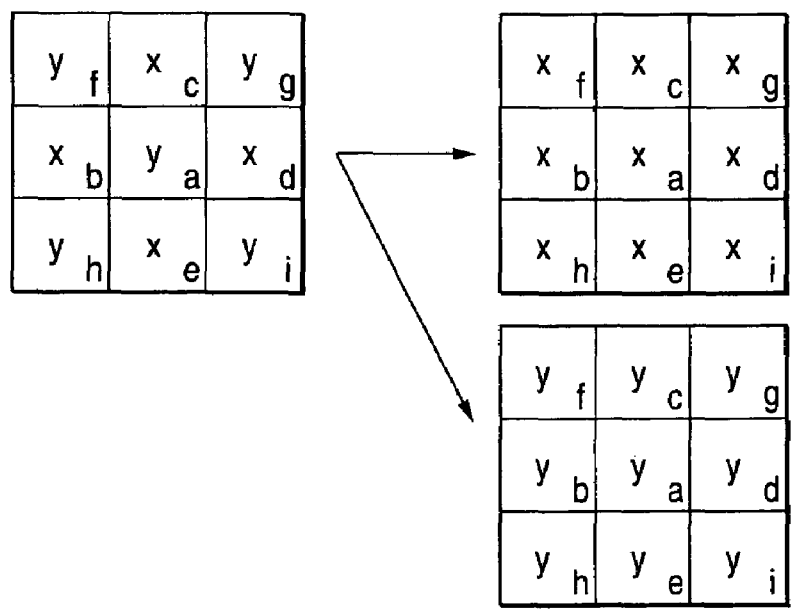
FIG. 13 is view illustrating the signal processing method in the third embodiment of the invention.

Next, the digital signal processing section 36 performs signal interpolation on the color signals x and y so that both the color signal x and the color signal y exist in each sample point (S3, see FIG. 13). For example, in a sample point where the color signal x does not exist, the color signal x is interpolated by using color signals x in the periphery of the sample point, or, in a sample point where the color signal y does not exist, the color signal y is interpolated by using color signals y in the periphery of the sample point. Signal interpolation can be performed by various techniques, and hence its description is omitted.

Next, the digital signal processing section 36 adds in a predetermined proportion the green signal, the color signal x, or the color signal y existing in each sample point to the green signals, the color signals x, or the color signals y existing in sample points in the periphery of the each sample point, to produce a color signal x (fifth color signal) which is obtained by blurring the color signal x, a color signal Y which is obtained by blurring the color signal y, and a color signal G' which is obtained by blurring the green signal (S4), in each sample point.

For example, the digital signal processing section 36 sets a signal obtained by: multiplying the color signal x in sample point a and the color signals x in sample points b to i in the periphery of sample point a by a predetermined coefficient; and cumulating the color signals x multiplied by the coefficient, as the color signal X in sample point a (see FIG. 14A).

Furthermore, a signal obtained by: multiplying the color signal y in sample point a and the color signals y in sample points b to i in the periphery of sample point a by a predetermined coefficient; and cumulating the color signals y multiplied by the coefficient is set as the color signal Y in sample point a (see FIG. 14B).

Moreover, a signal obtained by: multiplying the green signal in sample point a and the green signals in sample points b to i in the periphery of sample point a by a predetermined coefficient; and cumulating the green signals multiplied by the coefficient is set as the color signal G' in sample point a (see FIG. 14C).

As the coefficients set in the sample points, for example, coefficients in which sample point a is weighted as shown in FIG. 15A, or those in which all points are uniformly weighted as shown in FIG. 15B are used.

Color signals X(m, n), Y(m, n), and G'(m, n) which are produced in a sample point at coordinate (m, n) are obtained by following expressions (3), (4), and (5):

$$G'(m,n)=k(m-1,n+1)*g(m-1,n+1)+k(m,n+1)*g(m,n+1)+k(m+1,n+1)*g(m+1,n+1)+k(m-1,n)*g(m-1,n)+k(m,n)*g(m,n)+k(m+1,n)*g(m+1,n)+k(m-1,n-1)*g(m-1,n-1)+k(m,n-1)*g(m,n-1)+k(m+1,n-1)*g(m+1,n-1) \quad (3)$$

$$X(m,n)=k(m-1,n+1)*x(m-1,n+1)+k(m,n+1)*x(m,n+1)+k(m+1,n+1)*x(m+1,n+1)+k(m-1,n)*x(m-1,n)+k(m,n)*x(m,n)+k(m+1,n)*x(m+1,n)+k(m-1,n-1)*x(m-1,n-1)+k(m,n-1)*x(m,n-1)+k(m+1,n-1)*x(m+1,n-1) \quad (4)$$

$$Y(m,n)=k(m-1,n+1)*y(m-1,n+1)+k(m,n+1)*y(m,n+1)+k(m+1,n+1)*y(m+1,n+1)+k(m-1,n)*y(m-1,n)+k(m,n)*y(m,n)+k(m+1,n)*y(m+1,n)+k(m-1,n-1)*y(m-1,n-1)+k(m,n-1)*y(m,n-1)+k(m+1,n-1)*y(m+1,n-1) \quad (5)$$

Originally, the color signal x is a signal which is obtained by subtracting a green signal from a red signal. When the blurred color signal G' is added to the blurred color signal X, therefore, the blurred red signal R can be obtained. Similarly, the color signal y is a signal which is obtained by subtracting a green signal from a blue signal. When the blurred color signal G' is added to the blurred color signal Y, therefore, the blurred blue signal B can be obtained. The digital signal processing section 36 obtains the blurred color signals R and B by following expressions (6) and (7) (S5):

$$R(m,n)=X(m,n)+G'(m,n) \quad (6)$$

$$B(m,n)=Y(m,n)+G'(m,n) \quad (7)$$

where R(m, n) is the blurred color signal R at coordinate (m, n), and B(m, n) is the blurred color signal B at coordinate (m, n).

Finally, from the blurred color signals R and B, the digital signal processing section 36 obtains a red color signal R' constituting one pixel data, and a blue color signal B' constituting one pixel data by following expressions (8) and (9), and obtains a green color signal G" constituting one pixel data by following expression (10) (S6):

$$R'(m,n)=R(m,n)+\{g(m,n)-G'(m,n)\}=X(m,n)+g(m,n) \quad (8)$$

$$B'(m,n)=B(m,n)+\{g(m,n)-G'(m,n)\}=Y(m,n)+g(m,n) \quad (9)$$

$$G''(m,n)=G'(m,n)+\{g(m,n)-G'(m,n)\}=g(m,n) \quad (10)$$

where R'(m, n) is the color signal R' produced in the sample point at coordinate (m, n), B'(m, n) is the color signal B' produced in the sample point at coordinate (m, n), and G"(m, n) is the color signal G" produced in the sample point at coordinate (m, n).

As result of the above signal process, the digital signal processing section 36 produces the red signal R', the blue signal B', and the green signal G".

As described above, according to the signal process in the embodiment, the color signals R' and B' constituting one pixel data are produced by using the green signal existing in all the sample points, and hence a false color can be made more inconspicuous as compared with the case where the color signals R' and B' are produced by using only red or blue signals existing in each sample point.

In the above description, the color signals R, B are once produced in S5 of FIG. 11. Alternatively, the color signals R, B may not be produced in this step, and, after S4, the green signal may be directly added to the color signal X to produce the color signal R' and the green signal may be directly added to the color signal Y to produce the color signal B'.

In the above description, the color signal X, the color signal Y, and the color signal G' are produced in S4 of FIG. 11 in each sample point. In a sample point where the color signal x exists after the process of S2 (equivalent to a sample point where a red signal exists), a red signal existing in the sample point can be directly treated as the color signal R'. In the sample point, therefore, the process of producing the color signal X, and adding a green signal to the color signal to produce the color signal R' may not be performed.

In a sample point where the color signal y exists after the process of S2 (equivalent to a sample point where a blue signal exists), similarly, a blue signal existing in the sample point can be directly treated as the color signal B'. In the sample point, therefore, the process of producing the color signal Y, and adding a green signal to the color signal to produce the color signal B' may not be performed.

In the signal process of the embodiment, preferably, a signal process such as described in the first embodiment (a process in which a red or blue signal existing in each sample point, and red or blue signals existing in sample points adjacent to the sample point are added together in a predetermined proportion to produce a new red or blue signal) is performed before the process of S1 of FIG. 11, and the process subsequent to S1 of FIG. 11 is performed with using the red or blue signal which is obtained in this signal process. According to the configuration, color image data in which a false color is not conspicuous, and the sensitivity is enhanced or the S/N is improved can be produced.

According to the invention, it is possible to provide a solid-state image pickup element that is a hybrid solid-state image pickup element which has a photoelectric converting film in an upper portion, and photoelectric converting elements made of silicon in a lower portion, and which can cope with increases in amount of signal charges generated in the photoelectric converting film, and in that of signal charges accumulated in the photoelectric converting elements.

According to the invention, it is also possible to provide an imaging pickup apparatus using the above-mentioned solid-state image pickup element.

The entire disclosure of each and every foreign patent application from which the benefit of foreign priority has been claimed in the present application is incorporated herein by reference, as if fully set forth.

What is claimed is:

1. A solid-state image pickup element comprising:
   a semiconductor substrate;
   a photoelectric converting film stacked above the semiconductor substrate;
   a plurality of photoelectric converting elements arranged in a row direction and a column direction perpendicular to the row direction on the semiconductor substrate, and accumulate signal charges;
   a plurality of signal charge accumulating portions in which signal charges generated in the photoelectric converting film are accumulated, the signal charge accumulating portions being arranged in the row direction and the column direction on the semiconductor substrate; and
   a signal read circuit which reads out to outside signals corresponding to signal charges accumulated in the photoelectric converting elements and the signal charge accumulating portions, the signal read circuit being formed in the semiconductor substrate,
   wherein the signal read circuit comprises:
   vertical transfer paths which read signal charges accumulated in the plural photoelectric converting elements and the signal charge accumulating portions, and which transfer the signal charges in the column direction;
   a horizontal transfer path which transfers signal charges transferred from the vertical transfer paths, in the row direction; and
   an output section which outputs color signals corresponding to the signal charges transferred from the horizontal transfer path, and
   wherein the vertical transfer paths are formed in such a manner that: two of the vertical transfer paths are present between first ones of said plurality of photoelectric converting elements, the first ones being adjacent to each other in the row direction; and two of the vertical transfer paths are present between second ones of said plurality of signal charge accumulating portions, the second ones being adjacent to each other in the row direction,
   the vertical transfer paths elongate in the column direction,
   the plurality of photoelectric converting elements comprises silicon, and
   the plurality of photoelectric converting elements and the plurality of signal charge accumulating portions are formed on a same plane of the substrate.

2. A solid-state image pickup element according to claim 1, wherein said plurality of photoelectric converting elements comprise include at least two kinds of photoelectric converting elements, each kind of which detect a color different from a color detected by the photoelectric converting film,
   there are formed first rows in which said at least two kinds of photoelectric converting elements are alternately arranged and second rows in which the signal charge accumulating portions are arranged,
   the first rows and the second rows alternately being arranged in such a manner that, in adjacent ones of the first rows and the second rows, those of the photoelectric converting elements and those of the signal charge accumulating portions are shifted from each other in the row direction by about ½ of arrangement pitches in the row direction of the photoelectric converting elements and the signal charge accumulating portions, and
   the vertical transfer paths are formed with meandering in the column direction.

3. A solid-state image pickup element according to claim 1, wherein the vertical transfer paths comprises:
   first vertical transfer paths which transfer only signal charges from the signal charge accumulating portions; and
   second vertical transfer paths which transfer only signal charges from the photoelectric converting elements.

4. A solid-state image pickup element according to claim 3, wherein a signal charge transfer capacity of the first vertical transfer paths is larger than a signal charge transfer capacity of the second vertical transfer paths.

5. A solid-state image pickup element according to claim 1, wherein the photoelectric converting film is sandwiched by pixel electrode films for respectively defining photoelectric converting regions of the photoelectric converting film, and an opposing electrode which is opposed to the pixel electrode films, and
   the pixel electrode films and the photoelectric converting elements are placed so as not to overlap with each other when viewed from a vertical direction to a plane of the semiconductor substrate.

6. A solid-state image pickup element according to claim 5, wherein the pixel electrode films comprises a metal.

7. A solid-state image pickup element according to claim 1, further comprising a plurality of microlenses which converge light respectively on said plurality of photoelectric converting elements, said plurality of microlenses being disposed above the photoelectric converting film.

8. A solid-state image pickup element according to claim 6, further comprising a plurality of microlenses which converge light respectively on said plurality of photoelectric converting elements, said plurality of microlenses being disposed between the photoelectric converting film and said plurality of photoelectric converting elements.

9. A solid-state image pickup element according to claim 1, wherein the photoelectric converting film detects green light, and said plurality of photoelectric converting elements comprise photoelectric converting elements which detect red light, and photoelectric converting elements which detect blue light.

10. A solid-state image pickup element according to claim 1, wherein the photoelectric converting film comprises an organic material.

11. The solid-state image pickup element of claim 1, further comprising:

a plurality of pixel electrode films disposed between the photoelectric converting film and the semiconductor substrate, wherein each pixel electrode film covers an individual signal charge accumulating portion and an adjacent individual photoelectric converting element, with each pixel electrode film not overlapping another pixel electrode film.

12. The solid-state image pickup element of claim 1, wherein:

the photoelectric converting film extends over an entire surface of the semiconductor substrate.

13. An image pickup apparatus comprising an imaging section including a solid-state image pickup element according to claim 1.

* * * * *